United States Patent
Chiu et al.

(10) Patent No.: US 8,570,746 B2
(45) Date of Patent: Oct. 29, 2013

(54) MOUNTING APPARATUS FOR HEAT DISSIPATING MEMBER

(75) Inventors: Po-Wen Chiu, New Taipei (TW); Wen-Hu Lu, Shenzhen (CN); Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 63 days.

(21) Appl. No.: 13/182,350

(22) Filed: Jul. 13, 2011

(65) Prior Publication Data
US 2012/0126080 A1    May 24, 2012

(30) Foreign Application Priority Data

Nov. 23, 2010  (CN) .......................... 2010 1 0555196

(51) Int. Cl.
H05K 7/20 (2006.01)
H01L 23/40 (2006.01)
(52) U.S. Cl.
CPC ................................. *H01L 23/4093* (2013.01)
USPC ............................................ 361/709; 361/704
(58) Field of Classification Search
USPC ........ 248/229.1, 694, 176.2, 680, 681, 299.1, 248/510, 500, 505; 361/709, 704, 719, 361/679.34–679.35; 165/80.3, 185, 104.33; 257/718–719; 29/271, 281.1; 312/222, 312/333, 334.44, 334.46, 223.1–223.2
See application file for complete search history.

(56) References Cited

U.S. PATENT DOCUMENTS

| | | | | |
|---|---|---|---|---|
| 6,160,709 A * | 12/2000 | Li | ................................... | 361/704 |
| 7,035,107 B2 * | 4/2006 | Eckblad et al. | ................ | 361/719 |
| 7,362,581 B2 * | 4/2008 | Chen | ............................. | 361/709 |
| 7,403,394 B2 * | 7/2008 | Chen | ............................. | 361/704 |
| 7,505,271 B2 * | 3/2009 | Chen | ............................. | 361/704 |
| 7,520,313 B2 * | 4/2009 | Lai et al. | ....................... | 165/80.3 |
| 7,755,903 B2 * | 7/2010 | Tsai et al. | ...................... | 361/719 |
| 8,300,397 B2 * | 10/2012 | Zhang | ...................... | 361/679.33 |
| 2004/0114332 A1 * | 6/2004 | Lee et al. | ....................... | 361/719 |
| 2005/0174739 A1 * | 8/2005 | Chen et al. | .................... | 361/704 |
| 2006/0018097 A1 * | 1/2006 | Lee et al. | ....................... | 361/704 |
| 2007/0230129 A1 * | 10/2007 | Chen | ............................. | 361/704 |
| 2007/0230136 A1 * | 10/2007 | Chen | ............................. | 361/719 |
| 2009/0034205 A1 * | 2/2009 | Li et al. | ......................... | 361/709 |

* cited by examiner

*Primary Examiner* — Terrell McKinnon
*Assistant Examiner* — Ingrid M Weinhold
(74) *Attorney, Agent, or Firm* — Altis & Wispro Law Group, Inc.

(57) ABSTRACT

A mounting apparatus includes a bracket, a mounting member and a handgrip. The bracket receives a heat dissipating member. A positioning post is located on the bracket. The mounting member, attached to the bracket and rotatable relative to the bracket, is adapted for abutting a portion of the heat dissipating member. The handgrip is attached to the mounting member and rotatable relative to the mounting member. The handgrip defines a guiding hole. The positioning post is engaged in the guiding hole.

2 Claims, 4 Drawing Sheets

MOUNTING APPARATUS FOR HEAT DISSIPATING MEMBER

BACKGROUND

1. Technical Field

The present disclosure relates to a mounting apparatus for heat dissipating member.

2. Description of Related Art

A heat sink is provided in a computer system to cool a CPU. The heat sink is usually secured to a motherboard with screws, which is very inconvenient in assembly or disassembly of the heat sink.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
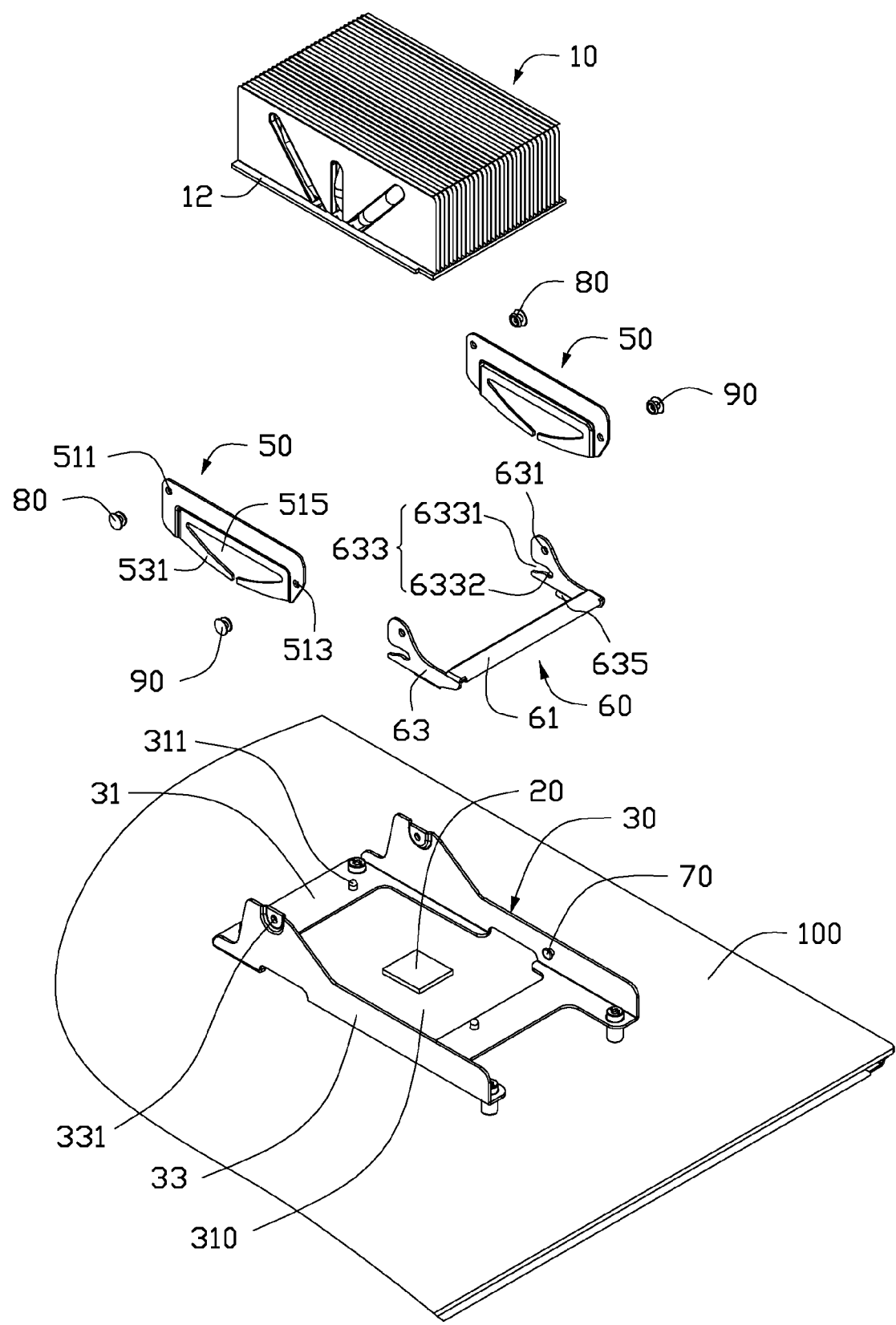
FIG. 1 is an exploded, isometric view of a mounting apparatus in accordance with an embodiment, a circuit board and a heat dissipating member.

Referring to FIG. 1, a mounting apparatus is adapted to secure a heat dissipating member 10 to a circuit board 100. The heat dissipating member 10 includes a mounting portion 12. Two positioning holes (not shown) are defined in a bottom of the heat dissipating member 10. In one embodiment, the heat dissipating member 10 may be a heat sink. A heat generating member 20 is located on the circuit board 100. The circuit board 100 may be, for example, a motherboard, and the heat generating member 20 may be a CPU.

The mounting apparatus in accordance with an embodiment includes a bracket 30, two mounting members 50 and a handgrip 60.

The bracket 30 includes a base portion 31 and two side portions 33 located on the base portion 31. A through opening 310 is defined in the base portion 31. Two positioning pins 311 are located on the base portion 31. The through opening 310 is located between the two positioning pins 311. A mounting hole 331 is defined in each side portion 33. A positioning post 70 is located on an inner surface of each side portion 33.

A first pivot hole 511 and a second pivot hole 513 are defined in opposite ends of each mounting member 50. A through hole 515 is defined in each mounting member 50. A pair of resilient arms 531 is located on each mounting member 50 in the through hole 515.

The handgrip 60 includes a grip portion 61 and two arm portions 63 located on two opposite ends of the grip portion 61. A guiding hole 633 is defined in each arm portion 63. Each guiding hole 633 includes an entrance region 6331 and a receiving region 6332 communicating with the entrance region 6331. The entrance region 6331 has a greater size than the receiving region 6332. A third pivot hole 631 is defined in each arm portion 63 above the corresponding guiding hole 633. A pressing portion 635 is located on each arm portion 63.

Figure 2:
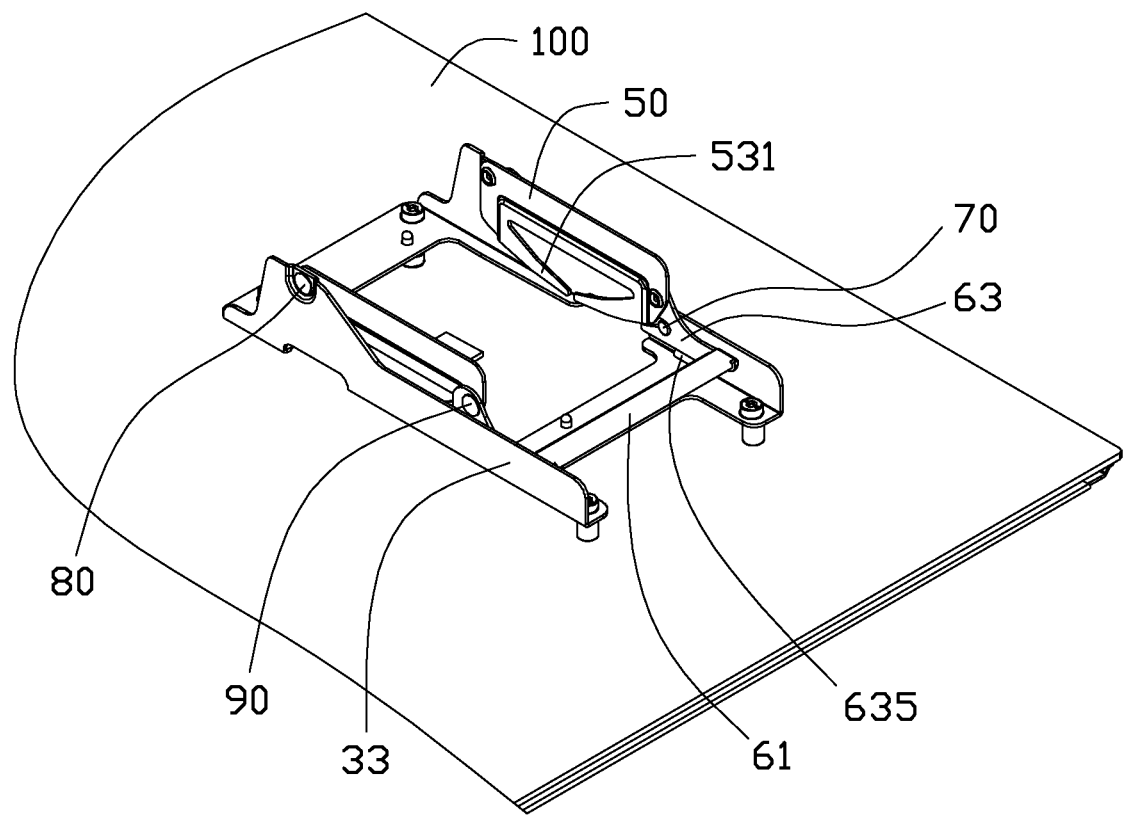
FIG. 2 is an assembled view of the mounting apparatus of FIG. 1.

Referring also to FIG. 2, in assembly, a first fastening member 80, such as a screw, or a rivet, is locked into the first pivot hole 511 of each mounting member 50 and corresponding mounting hole 331 of the bracket 30. The mounting members 50 are therefore rotatable relative to the bracket around the first fastening members 80. A second fastening member 90, such as a screw, or a rivet, is located into the second pivot hole 513 of each mounting member 50 and the third pivot hole 631 of the corresponding arm portion 63. The handgrip 60 is therefore rotatable relative to the mounting members 50 around the second fastening members 90.

Figure 3:
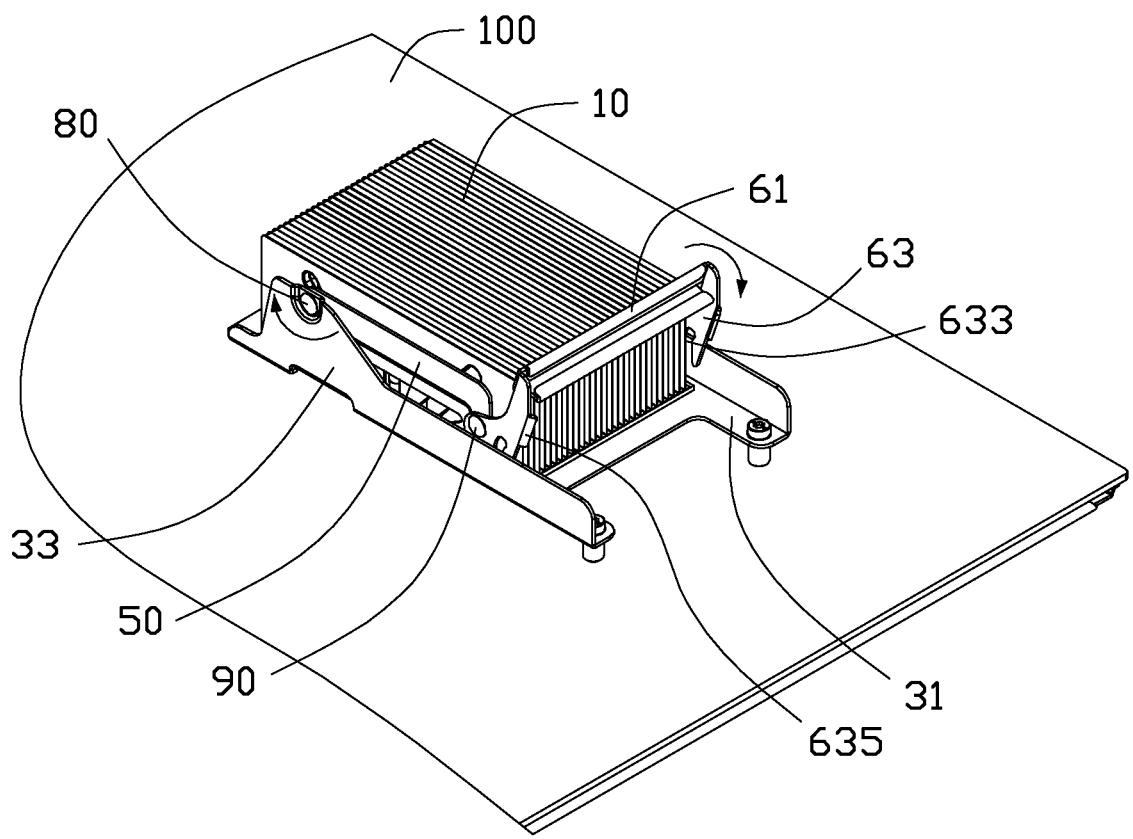
FIG. 3 is an assembled view of FIG. 1, showing a handgrip in an unlocked position.
Figure 4:
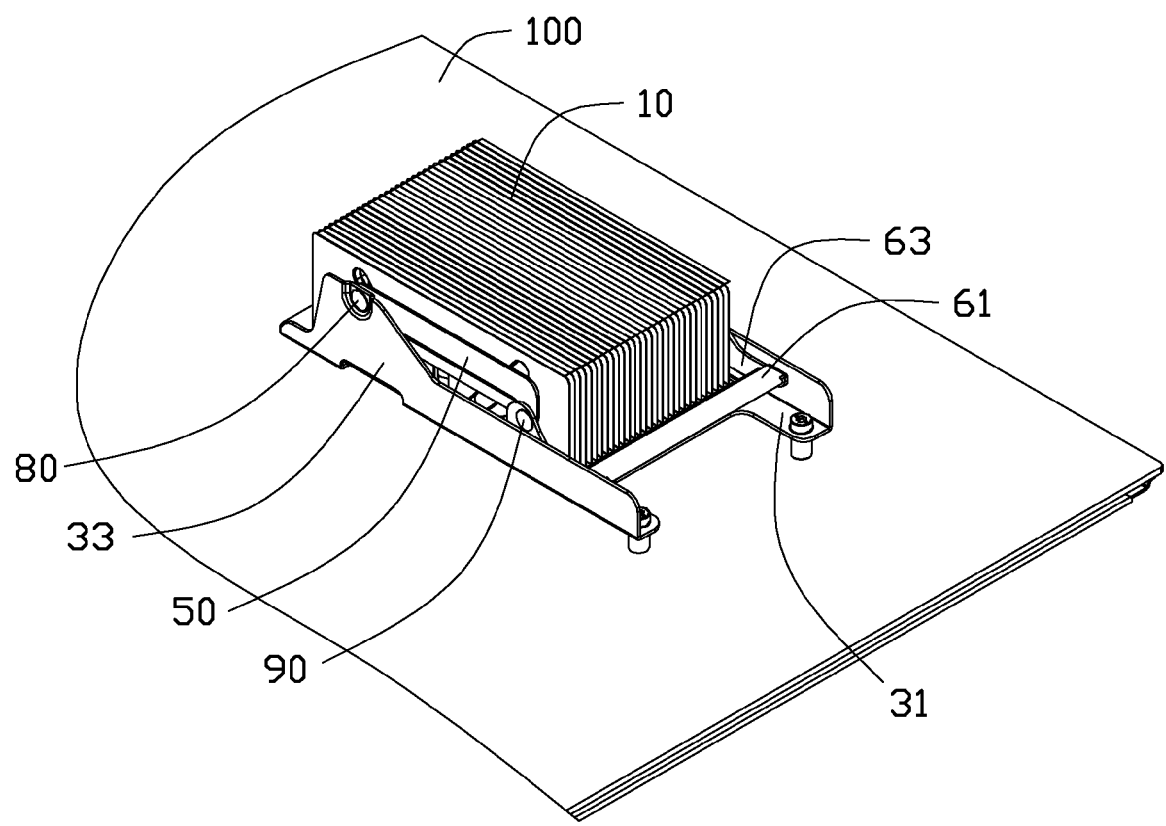
FIG. 4 is similar to FIG. 3, but shows the handgrip in a locked position.

Referring also to FIGS. 3-4, the heat dissipating member 10 is placed on the base portion 31 of the bracket 30 between the side portions 33. The positioning pins 311 are inserted in the positioning holes of the heat dissipating member 10, to prevent the heat dissipating member 10 from moving along the base portion 31. The mounting member 50 is rotated downward relative to the bracket 30, until the resilient arms 531 abut on the mounting portion 12. The handgrip 60 is rotated downward relative to the mounting members 50. The positioning posts 70 are slid into the guiding holes 633 from the entrance region 6331 to the receiving region 6332. The resilient arms 531 press the mounting portion 12 of the heat dissipating member 10 and are resiliently deformed. When the positioning posts 70 are engaged in the receiving regions 6332 of the guiding holes 633, the handgrip 60 engages with the side portions 33 and is in a locked position. The mounting portion 12 of the heat dissipating member 10 is pressed by the resilient arms 531 and positioned between the resilient arms 531 and the base portion 31. The pressing portions 635 abut on the mounting portion 12 of the heat dissipating member 10. The heat dissipating member 10 is therefore secured in the bracket 30.

In disassembly of the heat dissipating member 10, the handgrip 60 is rotated upward. The positioning posts 70 are slid from the receiving region 6332 to the entrance region 6331. When the positioning posts 70 are slid out of the guiding holes 633, the mounting members 50 can be rotated upward to release the mounting portion 12. The handgrip 60 is disengaged from the mounting members 50 and is in an unlocked position. Therefore, the heat dissipating member 10 can be taken out of the bracket 30.

In one embodiment, the bracket 30 of the mounting apparatus is secured to the circuit board 100. The heat generating member 20 is located in the through opening 310 of the bracket 30. When the heat dissipating member 10 is secured to the bracket 30, the heat dissipating member 10 abuts on the heat generating member 20, to cool the heat generating member 20.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus comprising:

a bracket adapted for receiving a heat dissipating member, the bracket comprising a base portion and two side portions extending from two opposite sides of the base portion;

a positioning post located on an inner surface of one of the two side portions and extending towards the other one of the two side portions;

a mounting member attached to the bracket and rotatable relative to the bracket;

a resilient arm located on the mounting member, the resilient arm being adapted to press a portion of the heat dissipating member; and a handgrip attached to the mounting member and rotatable relative to the mounting member, wherein the handgrip defines a guiding hole, and the positioning post is engaged in the guiding hole, the handgrip comprises a grip portion and two arm portions extending from two opposite ends of the grip portion, the guiding hole is defined in one of the two arm portions, and a pressing portion, extending from one of the two arm portions of the handgrip, is adapted to press the portion of the heat dissipating member.

2. A mounting apparatus comprising:

a bracket adapted for receiving a heat dissipating member, the bracket comprising a base portion and two side portions extending from two opposite sides of the base portion;

a positioning post located on an inner surface of one of the two side portions and extending towards the other one of the two side portions;

a mounting member attached to the bracket and rotatable relative to the bracket;

a resilient arm located on the mounting member, the resilient arm being adapted to press a portion of the heat dissipating member; and a handgrip attached to the mounting member and rotatable relative to the mounting member, the handgrip defining a guiding hole;

wherein the handgrip is rotatable between a first position, where the handgrip is disengaged from the bracket, and a second position, where the positioning post is engaged in the guiding hole; and the mounting member is rotated by the handgrip when the handgrip is rotated from the first position to the second position;

wherein the handgrip comprises a grip portion and two arm portions extending from two opposite ends of the grip portion, the guiding hole is defined in one of the two arm portions, and a pressing portion, extending from one of the two arm portions of the handgrip, is adapted to press the portion of the heat dissipating member when the handgrip is in the second position.

* * * * *